(12) United States Patent
Zhao et al.

(10) Patent No.: US 11,710,721 B2
(45) Date of Patent: Jul. 25, 2023

(54) DISPLAY DEVICE AND MANUFACTURING METHOD THEREOF

(71) Applicants: Beijing BOE Optoelectronics Technology Co., Ltd., Beijing (CN); BOE Technology Group Co., Ltd., Beijing (CN)

(72) Inventors: Tielei Zhao, Beijing (CN); Rui Han, Beijing (CN); Jie Yu, Beijing (CN); Yaoyao Wang, Beijing (CN); Pengtao Li, Beijing (CN); Chunhua Wang, Beijing (CN); Meng Li, Beijing (CN); Xiaoqiao Dong, Beijing (CN); Xiaoxia Wang, Beijing (CN); Li Tian, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 309 days.

(21) Appl. No.: 17/226,149

(22) Filed: Apr. 9, 2021

(65) Prior Publication Data
US 2022/0093566 A1    Mar. 24, 2022

(30) Foreign Application Priority Data
Sep. 23, 2020    (CN) .......................... 202011007669.5

(51) Int. Cl.
*H01L 25/065* (2023.01)
*G02F 1/1347* (2006.01)
(Continued)

(52) U.S. Cl.
CPC ........ *H01L 25/0657* (2013.01); *G02F 1/1347* (2013.01); *H01L 23/296* (2013.01);
(Continued)

(58) Field of Classification Search
CPC ... H01L 25/0657; H01L 25/50; H01L 23/296; H01L 23/3107; H01L 23/3157; G02F 1/1347
(Continued)

(56) References Cited

U.S. PATENT DOCUMENTS

2012/0313241 A1* 12/2012 Bower .................... H01L 24/13
257/737
2018/0059473 A1*  3/2018 Uchida ............. G02F 1/136213

* cited by examiner

*Primary Examiner* — Andargie M Aychillhum
(74) *Attorney, Agent, or Firm* — ArentFox Schiff LLP; Michael Fainberg

(57) ABSTRACT

A display device and a manufacturing method thereof are provided. The display device includes: a first array substrate, a first opposite substrate, a second array substrate and a second opposite substrate stacked in sequence; the first array substrate comprises a first overlap portion overlapping with the first opposite substrate, a first extension portion extending from the first overlap portion, and the second array substrate comprises a second overlap portion overlapping with the second opposite substrate, a second extension portion extending from the second overlap portion; a side, facing the second extension portion, of the first extension portion comprises a first control IC, and a side, away from the first extension portion, of the second extension portion comprises a second control IC; and a space between the first and the second extension portions is filled with a heat dissipation component at least in an area where the first control IC is.

16 Claims, 6 Drawing Sheets

(51) Int. Cl.
  *H01L 23/29* (2006.01)
  *H01L 23/31* (2006.01)
  *H01L 25/00* (2006.01)
(52) U.S. Cl.
  CPC ...... *H01L 23/3107* (2013.01); *H01L 23/3157* (2013.01); *H01L 25/50* (2013.01)
(58) Field of Classification Search
  USPC .......................................................... 361/749
  See application file for complete search history.

DISPLAY DEVICE AND MANUFACTURING METHOD THEREOF

CROSS-REFERENCE TO RELATED APPLICATION

This application is based on and claims priority under 35 U.S.C 119 to Chinese Patent Application No. 202011007669.5, filed on Sep. 23, 2020, in the China National Intellectual Property Administration. The entire disclosure of the above application is incorporated herein by reference.

FIELD

The present disclosure relates to the technical field of display, in particular to a display device and a manufacturing method thereof.

BACKGROUND

With the current development of a liquid crystal display (LCD) television technology, users have higher and higher requirements for image quality. A double-layer display panel technology is a novel LCD technology in which one more LCD panel than a conventional LCD module is added to improve the control capacity for luminous flux of backlight, the contrast of LCD TVs can be greatly increased, and thus, the consumer experience is improved.

SUMMARY

Some embodiments of the present disclosure provide a display device, including: a first array substrate, a first opposite substrate, a second array substrate and a second opposite substrate stacked in sequence; the first array substrate comprises a first overlap portion overlapping with the first opposite substrate, and a first extension portion extending from the first overlap portion, and the second array substrate comprises a second overlap portion overlapping with the second opposite substrate, and a second extension portion extending from the second overlap portion; a side, facing the second extension portion, of the first extension portion is provided with a first control IC, and a side, away from the first extension portion, of the second extension portion is provided with a second control IC; and a space between the first extension portion and the second extension portion is filled with a heat dissipation component at least in an area where the first control IC is located.

In some embodiments, an entire space between the first extension portion and the second extension portion is filled with the heat dissipation component, and a shape of the heat dissipation component is complementary to a shape of the entire space.

In some embodiments, a position, where the first control IC is located, of the heat dissipation component comprises a first recessed portion matching with the first control IC in shape, and the first control IC is embedded in the first recessed portion.

In some embodiments, a side, facing the second extension portion, of the first extension portion comprises a first flexible printed circuit, and the first flexible printed circuit is located on a side, away from the first opposite substrate, of the first control IC; and a position, where the first flexible printed circuit is located, of the heat dissipation component comprises a second recessed portion matching with the first flexible printed circuit in shape, and the first flexible printed circuit is embedded in the second recessed portion.

In some embodiments, an optical clear adhesive is arranged between the first opposite substrate and the second array substrate; the first opposite substrate comprises a third overlap portion overlapping with the optical clear adhesive, and a third extension portion extending from the third overlap portion; and a position, corresponding to the third extension portion, of the heat dissipation component comprises a third recessed portion matching with the third extension portion in shape, and the third extension portion is embedded in the third recessed portion.

In some embodiments, a first polaroid is arranged between the optical clear adhesive and the second array substrate, and the first polaroid overlaps with the optical clear adhesive; and in a direction from the first extension portion to the second extension portion, a thickness of the heat dissipation component in an area where the third recessed portion is located is the same as a sum of thicknesses of the optical clear adhesive and the first polaroid.

In some embodiments, in the direction from the first extension portion to the second extension portion, a depth of the third recessed portion is greater than a depth of the first recessed portion; and the depth of the first recessed portion is greater than the depth of a second recessed portion.

In some embodiments, a second polaroid is further arranged on a side, away from the first opposite substrate, of the first array substrate; and a third polaroid is further arranged on a side, away from the second array substrate, of the second opposite substrate.

In some embodiments, the heat dissipation component is made of foam.

In some embodiments, the foam is in a compressed state.

In some embodiments, the heat dissipation component is made of thermally conductive silicone grease.

Some embodiments of the present disclosure further provide a manufacturing method of the display device provided in embodiments of the present disclosure. The method includes:

aligning and adhering the first array substrate to the first opposite substrate;

forming the first control IC on the first extension portion of the first array substrate, and forming the second control IC on the second extension portion of the second array substrate; and aligning and adhering the side, away from the first array substrate, of the first opposite substrate to the side, away from the second opposite substrate, of the second array substrate, and filling a space between the first extension portion and the second extension portion with a heat dissipation component.

In some embodiments, the heat dissipation component is foam; the forming the second array substrate and the first opposite substrate adhered to each other with the heat dissipation component being formed between the first extension portion and the second extension portion includes:

adhering the foam to the first extension portion;

adhering an optical clear adhesive to the side, away from the first array substrate, of the first opposite substrate; and aligning and adhering the side, away from the first array substrate, of the first opposite substrate to the side, away from the second opposite substrate, of the second array substrate.

In some embodiments, the adhering the foam to the first extension portion includes: adhering the foam to the first extension portion, and enabling a height of the adhered foam in a direction perpendicular to the first extension portion to be greater than a height of the optical clear adhesive in a direction perpendicular to the first extension portion.

In some embodiments, the heat dissipation component is thermally conductive silicone grease; the forming the second array substrate and the first opposite substrate adhered to each other with the heat dissipation component being formed between the first extension portion and the second extension portion includes:

adhering the optical clear adhesive to the side, away from the first array substrate, of the first opposite substrate;

aligning and adhering the side, away from the first array substrate, of the first opposite substrate to the side, away from the second opposite substrate, of the second array substrate; and injecting thermally conductive silicone grease into a space between the first extension portion and the second extension portion.

In some embodiments, in response to that the thermally conductive silicone grease is injected into the space between the first extension portion and the second extension portion, the method further includes: scraping off excess thermally conductive silicone grease at edges in a semi-cured state.

In some embodiments, in response to that the first control IC is formed on the first extension portion of the first array substrate, and the second control IC is formed on the second extension portion of the second array substrate, the method further includes:

bonding a first flexible printed circuit to the first extension portion of the first array substrate, and bonding a second flexible printed circuit to the second extension portion of the second array substrate.

DETAILED DESCRIPTION OF THE EMBODIMENTS

In order to make the purposes, technical solutions and advantages of the embodiments of the present disclosure clearer, the technical solutions of the embodiments of the present disclosure will be clearly and completely described below in conjunction with the accompanying drawings of the embodiments of the present disclosure. Apparently, the described embodiments are a part of the embodiments of the present disclosure, rather than all of the embodiments. Based on the described embodiments of the present disclosure, all other embodiments obtained by those of ordinary skill in the art without creative work fall within the protection scope of the present disclosure.

Unless otherwise defined, technical terms or scientific terms used in the present disclosure shall have the ordinary meanings as understood by those of ordinary skill in the art to which the present disclosure belongs. The words "first", "second" and the like used in the present disclosure do not indicate any order, quantity or importance, but are only used to distinguish different components. The words "include" or "comprise" and the like are intended to mean that the element or object appearing before the words covers the element or object listed after the words and their equivalents, without excluding other elements or objects. Similar terms such as "connection" or "connected" are not limited to physical or mechanical connections, but may include electrical connection, whether direct or indirect. Words such as "upper", "lower", "left" and "right" are only used to indicate the relative position relationship. When the absolute position of the described object changes, the relative position relationship may also change accordingly.

In order to keep the following description of embodiments of the present disclosure clear and concise, detailed descriptions of known functions and components are omitted in the present disclosure.

Figure 1:
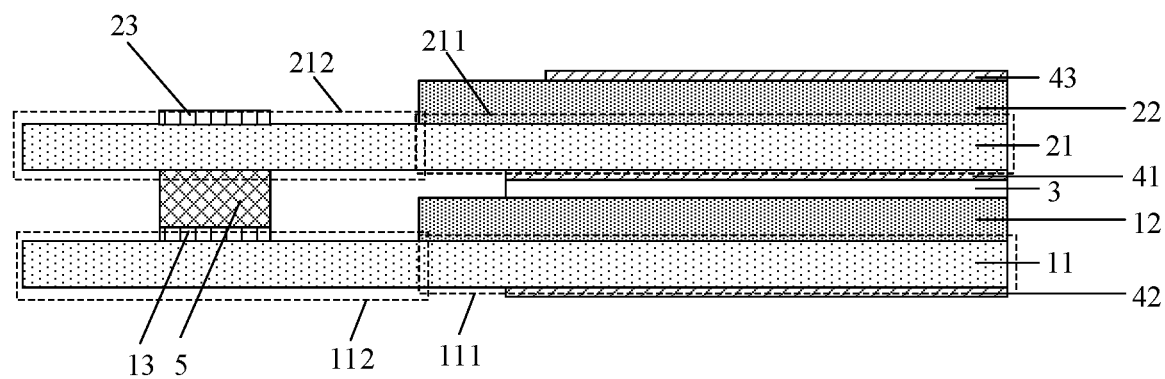
FIG. 1 is a schematic cross-sectional structure diagram of a display device provided in embodiments of the present disclosure.

Referring to FIG. 1, some embodiments of the present disclosure provide a display device, including: a first array substrate 11, a first opposite substrate 12, a second array substrate 21 and a second opposite substrate 22 stacked in sequence; the first array substrate 11 is provided with a first overlap portion 111 overlapping with the first opposite substrate 12, and a first extension portion 112 extending from the first overlap portion 111, and the second array substrate 21 is provided with a second overlap portion 211 overlapping with the second opposite substrate 22, and a second extension portion 212 extending from the second overlap portion 211; the side, facing the second extension portion 212, of the first extension portion 112 is provided with a first control integrated circuit, IC 13, and the side, away from the first extension portion 112, of the second extension portion 212 is provided with a second control IC 23; and a space between the first extension portion 112 and the second extension portion 212 is filled with a heat dissipation component 5 at least in an area where the first control IC 13 is located.

In some embodiments of the present disclosure, the space between the first extension portion 112 and the second extension portion 212 is filled with the heat dissipation component 5 at least in the area where the first control IC 13 is located. On one hand, a lower frame of the second array substrate 21 can no longer be in an overhanging state, the overall shock resistant reliability of the display device is enhanced, and meanwhile, the lower frame is effectively prevented from being crushed during transportation; and on the other hand, for the first control IC 13, due to the second array substrate 21 and the second opposite substrate 22 which are arranged above the first array substrate 11, and the second control IC 23 located on the second array substrate 21, the heat dissipation area is limited, which increases the heat of the second control IC 23, while in the embodiments of the present disclosure, the heat dissipation problem of the first control IC 13 and the second control IC 23 can be effectively solved by using a heat dissipation adhesive, and the high temperature reliability of the product is improved.

In some embodiments, the first array substrate 11 and the first opposite substrate may form a first liquid crystal cell, and the second array substrate 21 and the second opposite substrate 22 may form a second liquid crystal cell. The first liquid crystal cell may be used as a mono cell, and the second liquid crystal cell may be used as a color cell.

Figure 2:
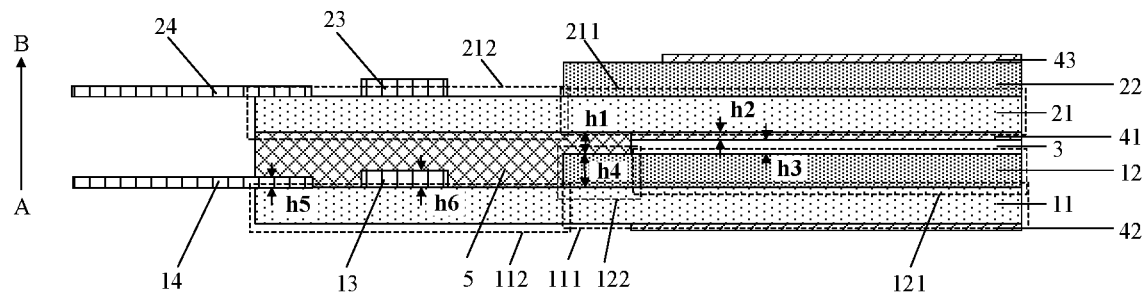
FIG. 2 is a schematic cross-sectional structure diagram of a specific display device provided in embodiments of the present disclosure.
Figure 3:
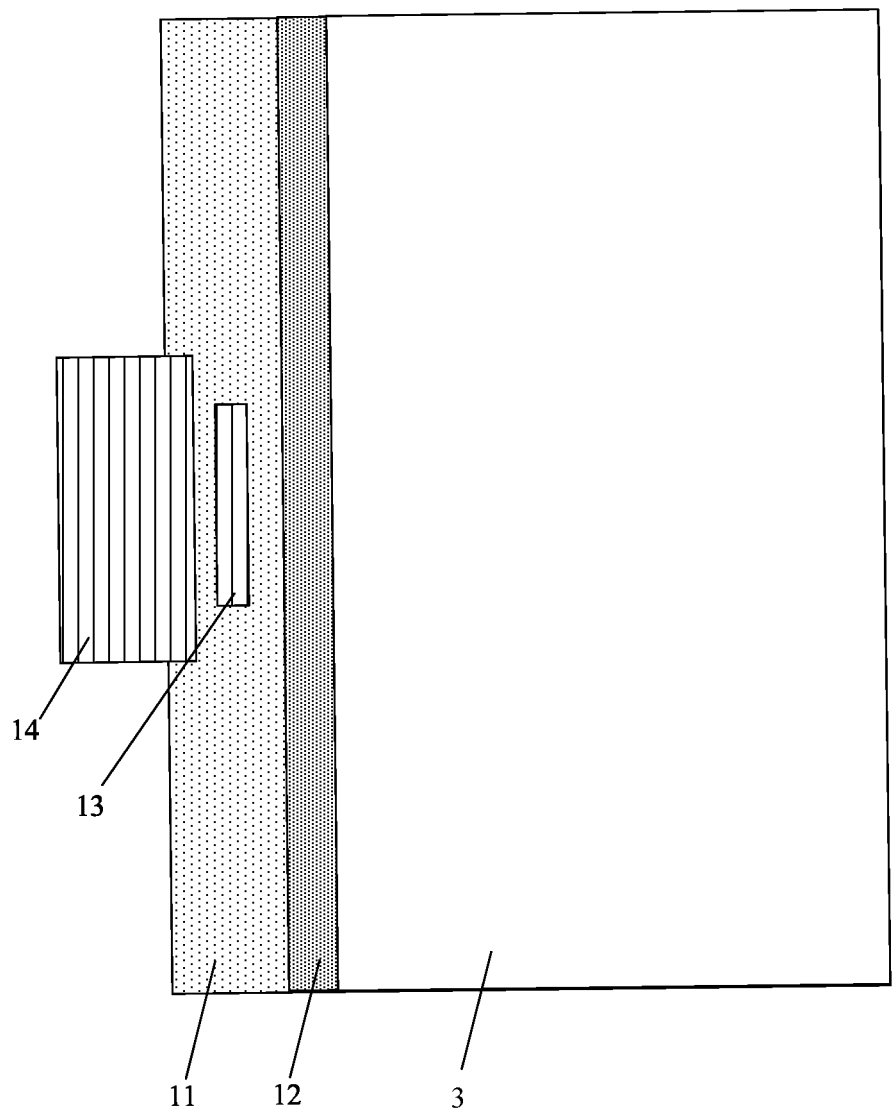
FIG. 3 is a schematic structural diagram of a top view of a first liquid crystal cell provided in embodiments of the present disclosure.

In some embodiments, the heat dissipation component 5 may be arranged only in a space where the first control IC 13 is located, or the entire space between the first extension portion 112 and the second extension portion 212 may be filled with the heat dissipation component 5, and the shape of the heat dissipation component 5 is complementary to the shape of the entire space, as shown in FIG. 2. In some embodiments of the present disclosure, the entire space between the first extension portion 112 and the second extension portion 212 is filled with the heat dissipation component 5, and thus, the display device may have the best effects of avoiding frames from being easily broken, and quickly dissipating heat.

Figure 4:
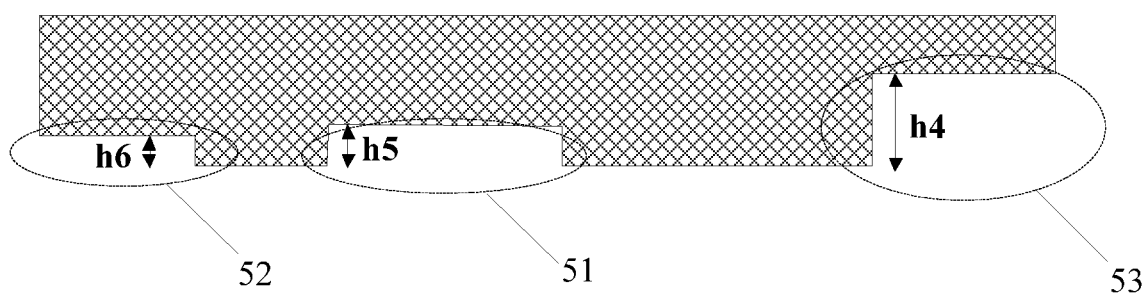
FIG. 4 is a schematic cross-sectional structure diagram of a heat dissipation component provided in embodiments of the present disclosure.
Figure 5:
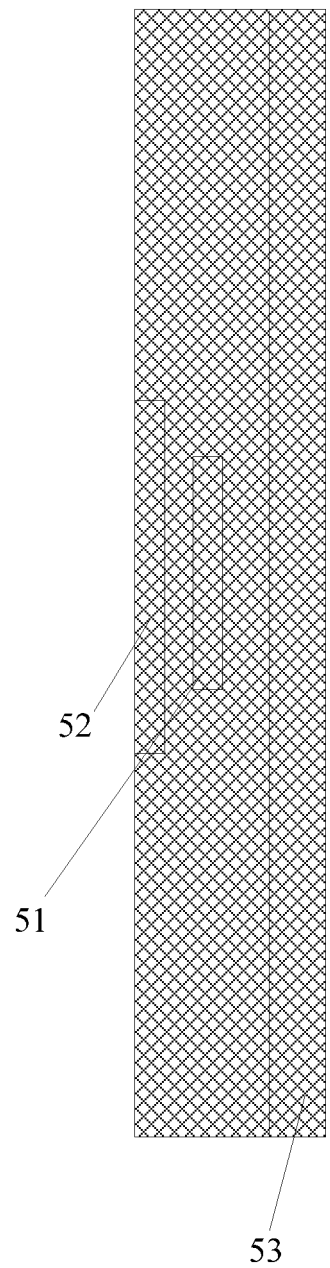
FIG. 5 is a schematic structural diagram of a top view of a heat dissipation component provided in embodiments of the present disclosure.

In some embodiments, as shown in FIG. 2, FIG. 3, FIG. 4 and FIG. 5, FIG. 3 is a schematic top view of the first liquid crystal cell, FIG. 5 is a schematic top view of the heat dissipation component 5, the position, where the first control IC 13 is located, of the heat dissipation component 5 is provided with a first recessed portion 51 matching with the first control IC 13 in shape, and the first control IC 13 is embedded in the first recessed portion 51.

In some embodiments, as shown in FIG. 2, FIG. 3, FIG. 4 and FIG. 5, the side, facing the second extension portion 212, of the first extension portion 112 is provided with a first flexible printed circuit 14, and the first flexible printed circuit 14 is located on the side, away from the first opposite substrate 12, of the first control IC 13; the position, where the first flexible printed circuit 14 is located, of the heat dissipation component 5 is provided with a second recessed portion 52 matching with the first flexible printed circuit 14 in shape, and the first flexible printed circuit 14 is embedded in the second recessed portion 52. It should be understood that the shape of the second recessed portion 52 matches with the shape of the first flexible printed circuit 14, which should be regarded that the shape of the second recessed portion 52 matches with the shape of the portion, located at the first extension portion 112, of the first flexible printed circuit 14.

In some embodiments, as shown in FIG. 2, FIG. 3, FIG. 4 and FIG. 5, an optical clear adhesive 3 is arranged between the first opposite substrate 12 and the second array substrate 21; the first opposite substrate 12 is provided with a third overlap portion 121 overlapping with the optical clear adhesive 3, and a third extension portion 122 extending from the third overlap portion 121; the position, corresponding to the third extension portion 122, of the heat dissipation component 5 is provided with a third recessed portion 53 matching with the third extension portion 122 in shape, and the third extension portion 122 is embedded in the third recessed portion 53. It should be understood that the shape of the third recessed portion 53 matches with the shape of the third extension portion 122, which should be regarded that the shape of the third recessed portion 53 matches with the shape of the portion, located on the first opposite substrate 12, of the third extension portion 122.

In some embodiments, as shown in FIG. 2, a first polaroid 41 is arranged between the optical clear adhesive 3 and the second array substrate 21, and the first polaroid 41 overlaps with the optical clear adhesive 3; in a direction AB from the first extension portion 112 to the second extension portion 212, the thickness of the heat dissipation component 5 in the area where the third recessed portion 53 is located is the same as the sum of the thicknesses of the optical clear adhesive 3 and the first polaroid 41, that is h1=h2+h3.

In some embodiments, as shown in FIG. 2 or FIG. 4, in the direction AB from the first extension portion 112 to the second extension portion 212, the depth h4 of the third recessed portion 53 is greater than the depth h6 of the first recessed portion 51; and the depth h6 of the first recessed portion 51 is greater than the depth h5 of the second recessed portion 52.

In some embodiments, as shown in FIG. 2, a second polaroid 42 is further arranged on the side, away from the first opposite substrate 12, of the first array substrate 11; and a third polaroid 43 is further arranged on the side, away from the second array substrate 21, of the second opposite substrate 22.

In some embodiments, the heat dissipation component 5 may be made of foam. Optionally, the foam is in a compressed state. When the heat dissipation component 5 made of foam is specifically manufactured, the height of the foam may be greater than the height of the adhered optical clear adhesive 3 at the side, away from the first array substrate 11, of the first opposite substrate 12, so that the foam is firmly located in the space between the first extension portion 112 and the second extension portion 212.

In some embodiments, the heat dissipation component 5 may also be made of thermally conductive silicone grease.

Figure 6:
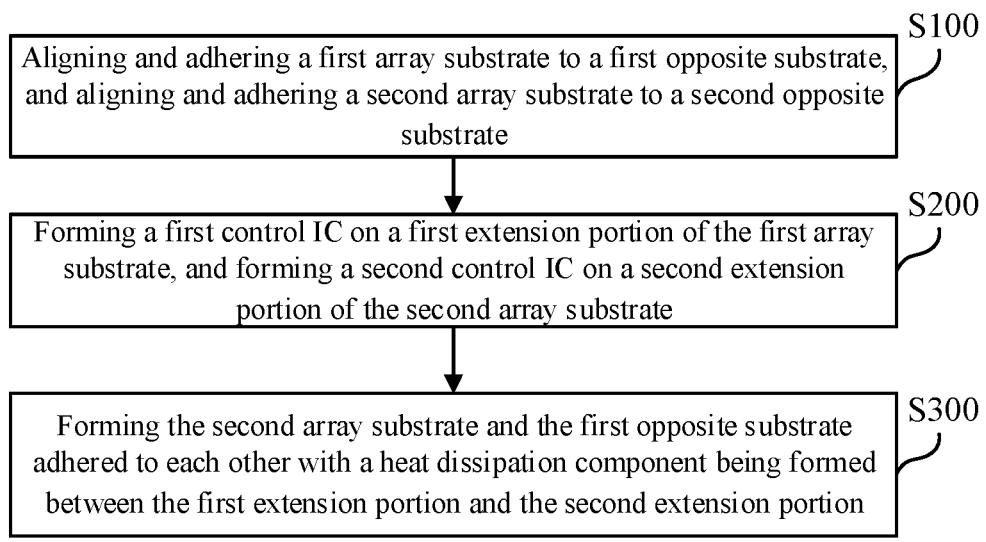
FIG. 6 is a schematic diagram of a manufacturing process of a display device provided in embodiments of the present disclosure.

Based on the same inventive concept, referring to FIG. 6, some embodiments of the present disclosure further provide a manufacturing method of the display device provided in the embodiments of the present disclosure. The method includes:

S100: a first array substrate is aligned and adhered to a first opposite substrate, and a second array substrate is aligned and adhered to a second opposite substrate, wherein the first array substrate is provided with a first overlap portion overlapping with the first opposite substrate, and a first extension portion extending from the first overlap portion, and the second array substrate is provided with a second overlap portion overlapping with the second opposite substrate, and a second extension portion extending from the second overlap portion;

S200: a first control IC is formed on the first extension portion of the first array substrate, and a second control IC is formed on the second extension portion of the second array substrate; and S300: the second array substrate and the first opposite substrate adhered to each other are formed with a heat dissipation component being formed between the first extension portion and the second extension portion.

Figure 7:
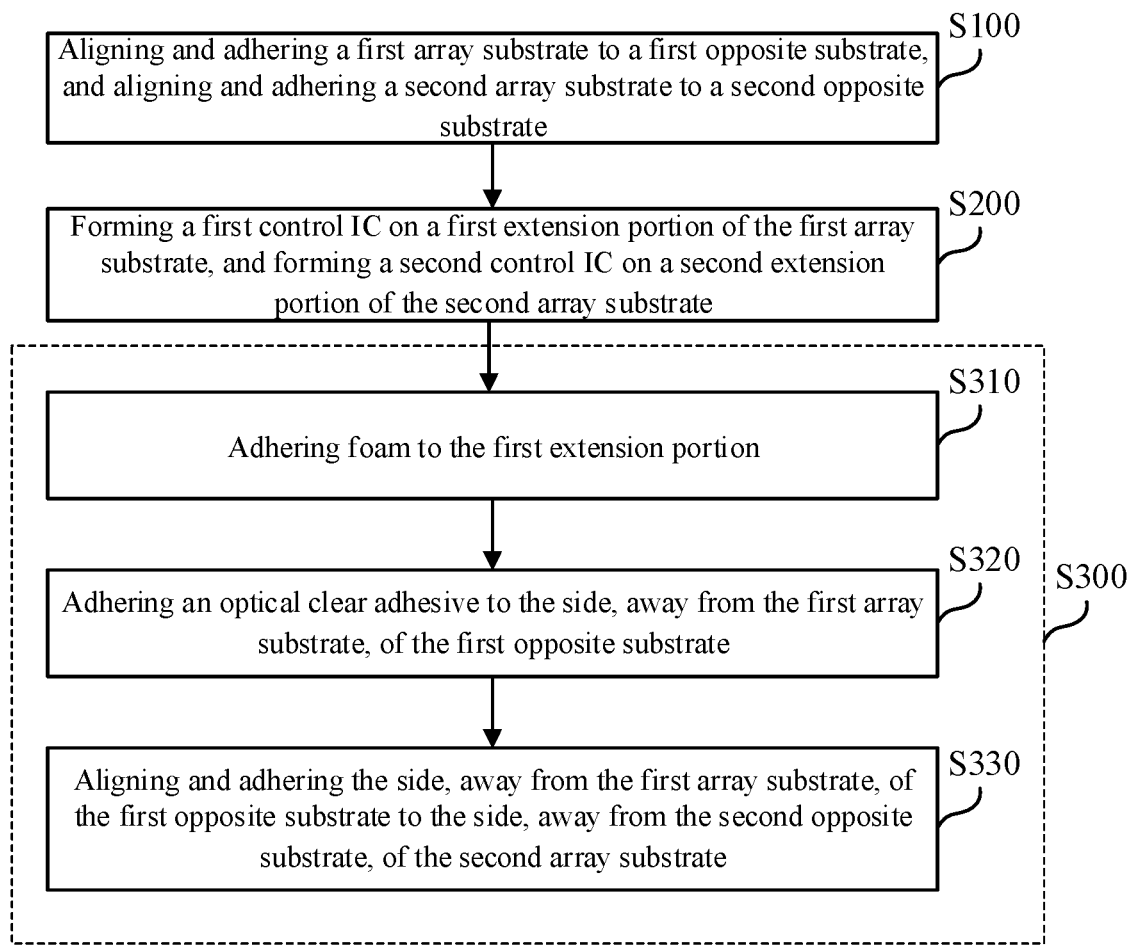
FIG. 7 is a schematic diagram of a manufacturing process of a specific display device provided in embodiments of the present disclosure.

In some embodiments, when the heat dissipation component is foam; S300, that is, the second array substrate and the first opposite substrate adhered to each other are formed with a heat dissipation component being formed between the first extension portion and the second extension portion, as shown in FIG. 7, may include:

S310: foam is adhered to the first extension portion; specifically, the foam is adhered to the first extension portion, and the height of the adhered foam in a direction perpendicular to the first extension portion is enabled to be greater than the height of the optical clear adhesive in a direction perpendicular to the first extension portion, so that the foam is firmly located in the space between the first extension portion 112 and the second extension portion 212;

S320: the optical clear adhesive is adhered to the side, away from the first array substrate, of the first opposite substrate; and S330: the side, away from the first array substrate, of the first opposite substrate is aligned and adhered to the side, away from the second opposite substrate, of the second array substrate.

Optionally, when the heat dissipation component is foam, the manufacturing method of the display device may include: the first liquid crystal cell (after the first array substrate and the first opposite substrate are aligned and adhered) and the second liquid crystal cell (after the second array substrate and the second opposite substrate are aligned and adhered) become films on glass (FOG) after the flexible printed circuit (FPC) bonding is completed. After the two FOGs are tested separately and there are no obvious defects, an optical clear adhesive color filter on array (COA) adhesion process is performed as the next step, thermally conductive foam is adhered to the lower frame of the lower liquid crystal cell at first before adhesion, the shape of the thermally conductive foam is shown in FIG. 2, including the position of the first control IC 13, the position of the first flexible printed circuit 14 and the position of a lower polaroid POL (that is, the first polaroid 41) of the upper liquid crystal cell, the shape of the foam on the position of the first control IC 13 is exactly the same as the size of the first control IC 13 to ensure good contact between the thermally conductive foam and the first control IC 13, so that heat can be smoothly dissipated; the size of the foam on the position of the first flexible printed circuit 14 is the same as the bonding size of the first flexible printed circuit 14 on the first array substrate 11, the size of the foam on the position of the lower polaroid (that is, the first polaroid 41) of the upper liquid crystal cell is the same as the size of a GAP between the first opposite substrate 12 (color filter, CF) of the lower liquid crystal cell and the second array substrate of the upper liquid crystal cell, the overall size of the foam is the same as the size of the lower frame of the first array substrate 11 so that the foam can completely fill the entire GAP; after the thermally conductive foam is adhered, an upper protective film of the lower liquid crystal cell is removed and cleaned at first, and meanwhile, a lower protective film of the upper liquid crystal cell is removed and cleaned; and after cleaning is completed, the optical clear adhesive is adhered to the upper surface of the lower liquid crystal cell, adhering equipment picks up the upper liquid crystal cell and aligns through a charge-coupled device (CCD), and the adhering equipment conducts automatic adhesion after alignment is completed.

Figure 8:
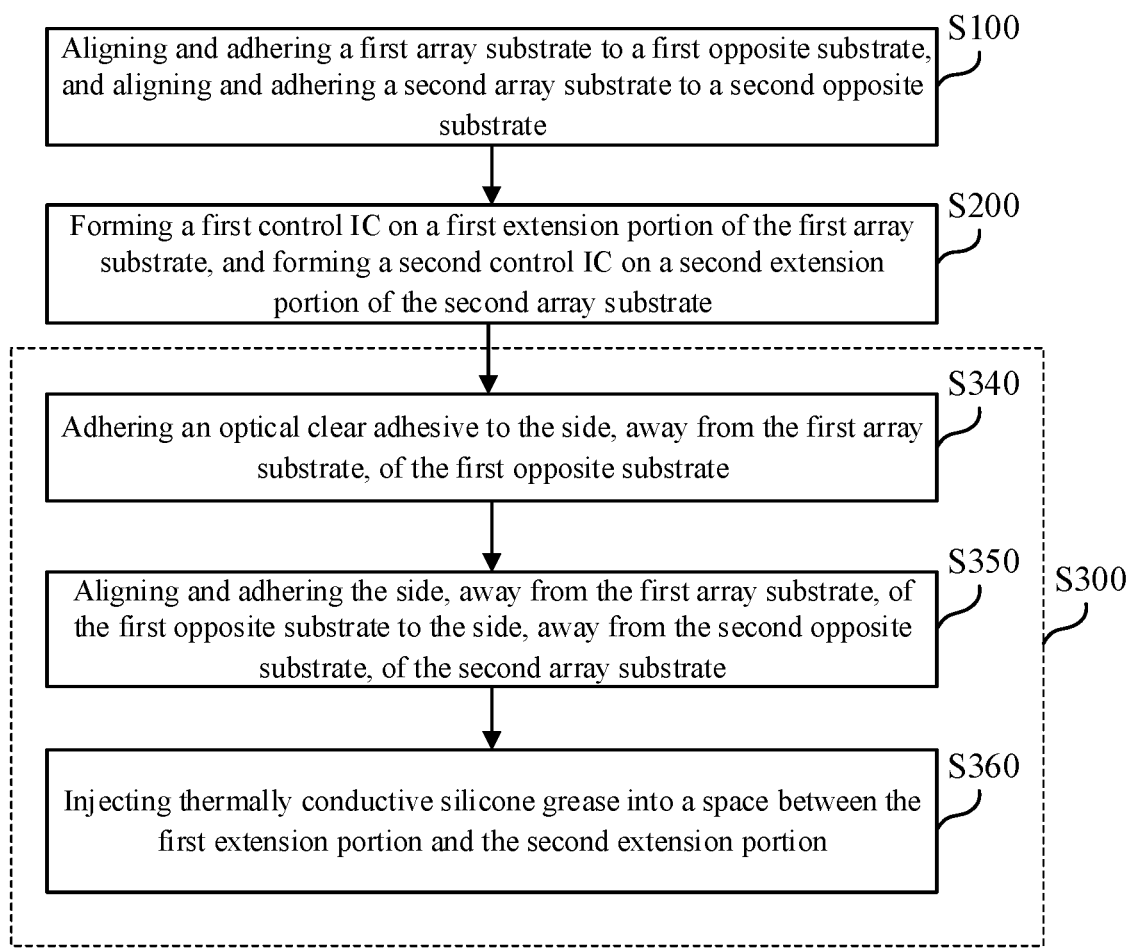
FIG. 8 is a schematic diagram of another manufacturing process of a specific display device provided in embodiments of the present disclosure.

In some embodiments, when the heat dissipation component is foam; S300, that is, the second array substrate and the first opposite substrate adhered to each other are formed with a heat dissipation component being formed between the first extension portion and the second extension portion, as shown in FIG. 8, may include:

S340: the optical clear adhesive is adhered to the side, away from the first array substrate, of the first opposite substrate;

S350: the side, away from the first array substrate, of the first opposite substrate is aligned and adhered to the side, away from the second opposite substrate, of the second array substrate; and S360: thermally conductive silicone grease is injected into a space between the first extension portion and the second extension portion. Specifically, when the thermally conductive silicone grease is injected into the space between the first extension portion and the second extension portion, the manufacturing method further includes: excess thermally conductive silicone grease at edges is scrapped off in a semi-cured state.

Optionally, when the heat dissipation component is thermally conductive silicone grease, the upper liquid crystal cell and the lower liquid crystal cell become FOGs after FPC bonding is completed. After the two FOGs are tested separately and there are no obvious defects, a COA adhesion process is performed, the upper protective film of the lower liquid crystal cell is removed and cleaned at first, and meanwhile, the lower protective film of the upper liquid crystal cell is removed and also cleaned. After the cleaning is completed, an OCA (Optical Clear Adhesive) is adhered to the upper surface of the lower liquid crystal cell, the adhering equipment picks up the upper liquid crystal cell and aligns through the CCD, and the adhering equipment conducts automatic adhesion after alignment is completed. After adhesion is completed, since the opposite substrates and the array substrates are not flush, there is a gap between the upper liquid crystal cell and the lower liquid crystal cell; if the double-layer liquid crystal cells are not thinned, the gap is about 1.12 mm; and if the thinned cells are used, the gap is about 0.32 mm. After the upper liquid crystal cell and the lower liquid crystal cell are adhered, the thermally conductive silicone grease is injected into the gap so that the thermally conductive silicone grease can fill the entire gap. After filling is completed, the excess thermally conductive silicone grease on side edges is scraped off in a semi-cured state to ensure the neatness of the side edges of the cell.

In some embodiments, when S200, that is, a first control IC on the first extension portion of the first array substrate is formed, and a second control IC on the second extension portion of the second array substrate is formed, is performed, the manufacturing method further includes: a first flexible printed circuit is bonded to the first extension portion of the first array substrate, and a second flexible printed circuit is bonded to the second extension portion of the second array substrate.

The beneficial effects of the embodiments of the present disclosure are described as follows: the space between the first extension portion and the second extension portion is filled with the heat dissipation component at least in the area where the first control IC is located, on the one hand, the lower frame of the second array substrate can no longer be in an overhanging state, the overall shock resistant reliability of the display device is enhanced, and meanwhile, the lower frame is effectively prevented from being crushed during transportation; and on the other hand, for the first control IC, due to the second array substrate and the second opposite substrate which are arranged above the first array substrate, and the second control IC located on the second array substrate, the heat dissipation area is limited, which increases the heat of the second control IC, while in the embodiments of the present disclosure, the heat dissipation problem of the first control IC and the second control IC can be effectively solved by using a heat dissipation adhesive, and the high temperature reliability of the product is improved.

Apparently, those skilled in the art can make various modifications and variations to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A display device, comprising: a first array substrate, a first opposite substrate, a second array substrate and a second opposite substrate stacked in sequence; the first array substrate comprises a first overlap portion overlapping with the first opposite substrate, and a first extension portion extending from the first overlap portion, and the second array substrate comprises a second overlap portion overlapping with the second opposite substrate, and a second extension portion extending from the second overlap portion; a side, facing the second extension portion, of the first extension portion is provided with a first control integrated circuit, IC, and a side, away from the first extension portion, of the second extension portion is provided with a second control IC; and a space between the first extension portion and the second extension portion is filled with a heat dissipation component at least in an area where the first control IC is located.

2. The display device of claim 1, wherein an entire space between the first extension portion and the second extension portion is filled with the heat dissipation component, and a shape of the heat dissipation component is complementary to a shape of the entire space.

3. The display device of claim 2, wherein a position, where the first control IC is located, of the heat dissipation component comprises a first recessed portion matching with the first control IC in shape, and the first control IC is embedded in the first recessed portion.

4. The display device of claim 3, wherein a side, facing the second extension portion, of the first extension portion is provided with a first flexible printed circuit, and the first flexible printed circuit is located on a side, away from the first opposite substrate, of the first control IC; and a position, where the first flexible printed circuit is located, of the heat dissipation component comprises a second recessed portion matching with the first flexible printed circuit in shape, and the first flexible printed circuit is embedded in the second recessed portion.

5. The display device of claim 1, wherein a first polaroid is arranged between the optical clear adhesive and the second array substrate, and the first polaroid overlaps with the optical clear adhesive; and in a direction from the first extension portion to the second extension portion, a thickness of the heat dissipation component in an area where the third recessed portion is located is same as a sum of thicknesses of the optical clear adhesive and the first polaroid.

6. The display device of claim 5, wherein in the direction from the first extension portion to the second extension portion, a depth of the third recessed portion is greater than a depth of the first recessed portion; and the depth of the first recessed portion is greater than a depth of the second recessed portion.

7. The display device of claim 1, wherein a second polaroid is further arranged on a side, away from the first opposite substrate, of the first array substrate; and a third polaroid is further arranged on a side, away from the second array substrate, of the second opposite substrate.

8. The display device of claim 1, wherein the heat dissipation component is made of foam.

9. The display device of claim 8, wherein the foam is in a compressed state.

10. The display device of claim 1, wherein the heat dissipation component is made of thermally conductive silicone grease.

11. A method for manufacturing the display device of claim 1, comprising:

aligning and adhering the first array substrate to the first opposite substrate; and aligning and adhering the second array substrate to the second opposite substrate;

forming the first control IC on a first extension portion of the first array substrate, and forming the second control IC on a second extension portion of the second array substrate; and forming the second array substrate and the first opposite substrate adhered to each other with a heat dissipation component being formed between the first extension portion and the second extension portion.

12. The manufacturing method of claim 11, wherein the heat dissipation component is foam; and the forming the second array substrate and the first opposite substrate adhered to each other with the heat dissipation component being formed between the first extension portion and the second extension portion comprises:

adhering the foam to the first extension portion;

adhering an optical clear adhesive to a side, away from the first array substrate, of the first opposite substrate; and aligning and adhering the side, away from the first array substrate, of the first opposite substrate to the side, away from the second opposite substrate, of the second array substrate.

13. The manufacturing method of claim 12, wherein the adhering the foam to the first extension portion comprises: adhering the foam to the first extension portion, and enabling a height of the adhered foam in a direction perpendicular to the first extension portion to be greater than a height of the optical clear adhesive in a direction perpendicular to the first extension portion.

14. The manufacturing method of claim 11, wherein the heat dissipation component is thermally conductive silicone grease; and the forming the second array substrate and the first opposite substrate adhered to each other with the heat dissipation component being formed between the first extension portion and the second extension portion comprises:

adhering an optical clear adhesive to the side, away from the first array substrate, of the first opposite substrate;

aligning and adhering the side, away from the first array substrate, of the first opposite substrate to the side, away from the second opposite substrate, of the second array substrate; and injecting thermally conductive silicone grease into a space between the first extension portion and the second extension portion.

15. The manufacturing method of claim 14, wherein in response to that the thermally conductive silicone grease is injected into the space between the first extension portion and the second extension portion, the method further comprises: scraping off excess thermally conductive silicone grease at edges in a semi-cured state.

16. The manufacturing method of claim 11, wherein in response to that the first control IC is formed on the first extension portion of the first array substrate, and the second control IC is formed on the second extension portion of the second array substrate, the method further comprises:

bonding a first flexible printed circuit to the first extension portion of the first array substrate, and bonding a second flexible printed circuit to the second extension portion of the second array substrate.

* * * * *